United States Patent
Zheng et al.

(10) Patent No.: US 11,652,183 B2
(45) Date of Patent: May 16, 2023

(54) INFRARED PHOTODETECTORS

(71) Applicant: William Marsh Rice University, Houston, TX (US)

(72) Inventors: Bob Yi Zheng, Houston, TX (US); Hangqi Zhao, Houston, TX (US); Benjamin Cerjan, Houston, TX (US); Mehbuba Tanzid, Houston, TX (US); Peter J. Nordlander, Houston, TX (US); Nancy J. Halas, Houston, TX (US)

(73) Assignee: William Marsh Rice University, Houston, TX (US)

( * ) Notice: Subject to any disclaimer, the term of this patent is extended or adjusted under 35 U.S.C. 154(b) by 197 days.

(21) Appl. No.: 16/899,759

(22) Filed: Jun. 12, 2020

(65) Prior Publication Data
US 2020/0395497 A1    Dec. 17, 2020

Related U.S. Application Data

(60) Provisional application No. 62/860,681, filed on Jun. 12, 2019.

(51) Int. Cl.
| | | |
|---|---|---|
| *H01L 31/101* | (2006.01) | |
| *G01J 5/20* | (2006.01) | |
| *G01J 5/00* | (2022.01) | |

(52) U.S. Cl.
CPC ............. *H01L 31/101* (2013.01); *G01J 5/20* (2013.01); *G01J 2005/0077* (2013.01)

(58) Field of Classification Search
CPC .... H01L 31/101; G01J 5/20; G01J 2005/0077
USPC ......................................................... 257/461
See application file for complete search history.

(56) References Cited

U.S. PATENT DOCUMENTS

| | | | |
|---|---|---|---|
| 4,318,115 A * | 3/1982 | Yoshikawa | ........... H01L 25/043 257/435 |
| 8,009,356 B1 | 8/2011 | Shaner et al. | |
| 9,240,511 B2 | 1/2016 | Lee et al. | |
| 9,806,217 B2 | 10/2017 | Zheng et al. | |
| 11,016,023 B1 * | 5/2021 | Mohara | .............. G01N 21/3581 |
| 2016/0005894 A1 * | 1/2016 | Zhang | .................. H01L 31/028 257/29 |

FOREIGN PATENT DOCUMENTS

WO    WO 2019/038823 A1 *   2/2019    ......... G01N 21/3581

OTHER PUBLICATIONS

Alavirad et. al., vol. 24, No. 20, Oct. 3, 2016, Optics Express 22544 (11 pages).

* cited by examiner

*Primary Examiner* — Tu-Tu V Ho
(74) *Attorney, Agent, or Firm* — Osha Bergman Watanabe & Burton LLP

(57) ABSTRACT

An infrared photodetector includes: a p-type and highly-doped silicon substrate; a metal structure disposed on the silicon substrate; a first electric contact to the silicon substrate; and a second electric contact to the metal structure.

14 Claims, 9 Drawing Sheets

INFRARED PHOTODETECTORS

CROSS-REFERENCE TO RELATED APPLICATIONS

This Application claims the benefit of U.S. Provisional Application 62/860,681 filed on Jun. 12, 2019 and is hereby incorporated by reference in its entirety.

STATEMENT REGARDING FEDERALLY SPONSORED RESEARCH OR DEVELOPMENT

This invention was made with Government Support under Grant Number W911NF-12-1-0407 awarded by the Department of Defense, U.S. Army Research Office, Grant Number FA9550-15-1-0022 awarded by the Department of Defense, Air Force Office of Scientific Research, Grant Number ECCS-1610229 awarded by the National Science Foundation and Grant Number HDTRA1-16-1-0042 awarded by the Department of Defense, Defense Threat Reduction Agency. The government has certain rights in this invention.

BACKGROUND

Infrared (IR) photodetectors are widely used in science and industry. For example, near-IR photodetectors may be used as receivers in telecom wavelengths. Further, Mid-IR photodetectors are widely used in molecular spectroscopy. However, high cost of currently available IR photodetectors, their bulkiness, and their complexity are some of their drawbacks. The development of this invention was funded in part by the Welch Foundation under Grant No. C-1220 and C-1222.

SUMMARY

One or more embodiments of the invention are directed to an infrared photodetector that includes: a p-type and highly doped silicon substrate; a metal structure disposed on the silicon substrate; a first electrical contact to the silicon substrate; and a second electrical contact to the metal structure.

One or more embodiments of the invention are directed to a method of measuring an absorbance spectrum of a material. The method includes: emitting infrared light on a plurality of infrared photodetectors such that the infrared light transmits through the material before reaching the infrared photodetectors; measuring an electrical signal of each of the infrared photodetectors generated in response to absorption of the infrared light by the infrared photodetectors; and calculating the absorption spectrum of the material based on the electrical signals of the infrared photodetectors and responsivities of the infrared photodetectors. The responsivity of each of the photodetectors is an electrical signal spectrum of the infrared photodetector divided by an infrared light spectrum that is received by the infrared detector and results into generating the electrical signal spectrum.

Other aspects and advantages of one or more embodiments disclosed herein will be apparent from the following description and the appended claims.

DETAILED DESCRIPTION

Figure 1A:
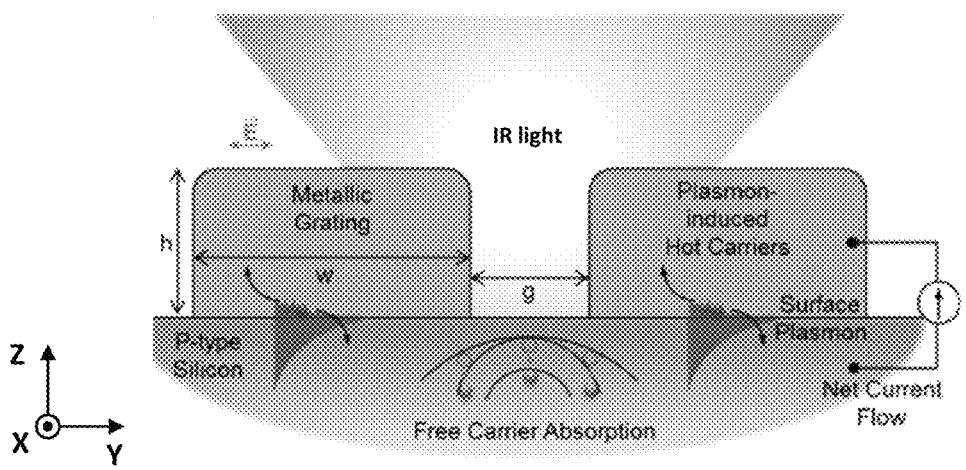
FIGS. 1A-1C show diagrams in accordance with one or more embodiments of the invention.

Specific embodiments of the invention will now be described in detail with reference to the accompanying figures. Like elements in the various figures are denoted by like reference numerals for consistency. Like elements may not be labeled in all figures for the sake of simplicity.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (for example, first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-9, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that, one or more of the steps shown in the flowcharts may be omitted, repeated, and/or performed in a different order than the order shown. Accordingly, the scope of the invention should not be considered limited to the specific arrangement of steps shown in the flowcharts.

Although multiply dependent claims are not introduced, it would be apparent to one of ordinary skill that the subject matter of the dependent claims of one or more embodiments may be combined with other dependent claims.

In general, an aspect of the embodiments of the invention is directed to an infrared (IR) photodetector that detects infrared light. The IR photodetector receives IR light and generates an electrical signal (for example, an electric current). Another aspect of the embodiments of the invention is directed to an IR spectrometer that is able to measure absorbance or molecular vibrations (i.e., stretching modes) of a material such as an organic material. Another aspect of the embodiments of the invention is directed to a method of measuring absorbance or molecular vibrations of a material using an IR spectrometer.

FIG. 1A shows a cross-sectional view of an IR photodetector that absorbs IR light and generates an electric current. The IR photodetector includes metal structures disposed on a silicon substrate.

In one or more embodiments, the metal structure may include geometrical dimensions that are small enough such that the metal structure can interact with the IR light. For this, the metal structure may include geometrical dimensions that are comparable with IR wavelengths. For example, the metal structure may include rods of metal, as shown in FIG. 1A, that are disposed next to each other such that a width (w) of the rods or a gap (g) between the rods is in the order of the IR wavelengths.

Figure 1B:
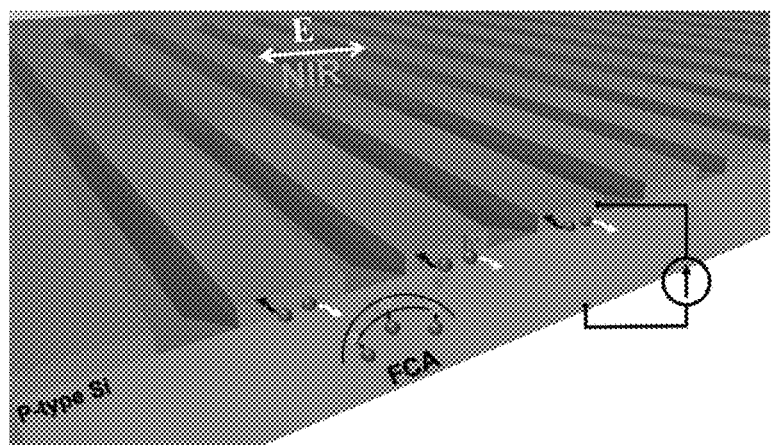
Figure 1C:
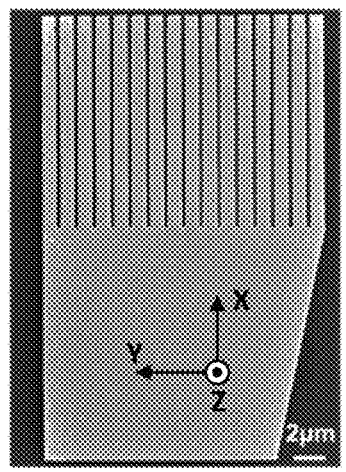

In one or more embodiments, the metal structure may be a metal grating. For example, FIG. 1B shows a schematic of a metal grating and FIG. 1C shows a top-view of a metal (gold (Au) in this instance) grating disposed on a silicon substrate via fabrication methods. A thin layer of Titanium (Ti) (for example, 2 nm) is disposed between the Au grating and the silicon substrate. The Ti layer works as an adhesion layer and reduces the Schottky barrier between the Au grating and the silicon substrate. The metal grating also may be designed such that a pitch (which is equal to w+g) of the metal grating may be comparable with the IR wavelengths.

In one or more embodiments, the metal structure may couple with the IR light such that oscillations of the IR light at IR frequencies cause oscillations of conductive electrons of the metal structure. This coupling may cause two mechanisms for the absorption of the IR light by the IR photodetector.

In one of the absorption mechanisms, the metal structure absorbs the IR light by energizing some of the electrons of the metal structure. These energized electrons are known as "hot electrons." This absorption mechanism is known as "plasmonic absorption." By putting the metal structure and the silicon substrate in a circuit as shown in FIGS. 1A-1B, the hot electrons may flow in the circuit as an electric current.

Hereinafter, a "responsivity" of the IR photodetector is defined as an electric signal (for example, an electrical current) of the IR photodetector that is generated by the IR light absorbed by the photodetector divided by the power of the IR light that is received by the IR photodetector. For example, if the IR photodetector receives 1 Watt (W) of the IR light at a specific wavelength and generates 2 milliampere (mA) of electric current because of the absorption of the IR light by the IR photodetector, the responsivity of the IR photodetector at that specific wavelength is 2 mA/W.

Figure 2A:
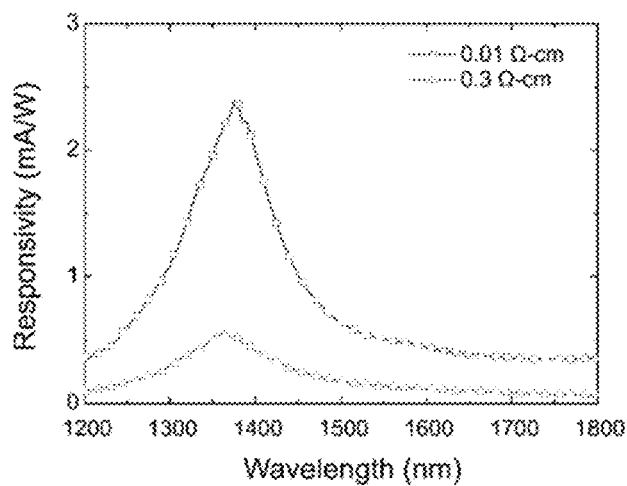
FIGS. 2A-2C show diagrams in accordance with one or more embodiments of the invention.

FIG. 2A shows responsivities of two IR photodetectors. One of the IR photodetectors includes an Au grating with a thickness (t), w, and g of 200, 900, and 250 nanometers (nm), respectively, on a crystal orientation of <100> of a boron-doped (p-type) silicon substrate with a resistivity of about 0.01 Ω·cm (doping concentration of $5\times10^{18}$). The other IR photodetector includes the same Au grating, but on a <100> boron-doped silicon substrate with a resistivity of about 0.3 Ω·cm. The responsivities of the two IR photodetectors in response to the IR light are shown in FIG. 2A. In the examples herein, the IR light has a linear polarization that is transverse to the length of the metal gratings. For example, as shown in FIGS. 1A-1B, the IR light (shown by "E," which stands for electric field) is polarized along the "Y" axis.

In one or more embodiments, the plasmonic absorption of the metal structure may have one or more peaks in the IR wavelength region. The plasmonic absorption peaks may result into responsivity peaks. For example, the responsivity peak of the Au grating shown in FIG. 1A has a peak at about wavelength of 1375 nm. The responsivity peaks may give information about the wavelength of the detected IR light. This is in contrast with generally uniform absorption in semiconductors.

Figure 2B:
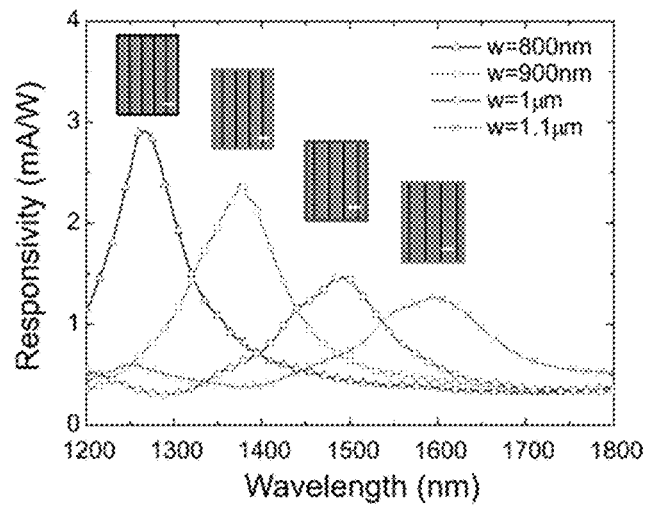

In one or more embodiments, the metal structure may be designed to have a responsivity peak at a specific wavelength. In other words, the responsivity peak can be tuned in wavelength by changing geometrical dimensions of the metal structure. For example, FIG. 2B shows responsivities of IR photodetectors that include Au gratings with t=200 nm and g=250 nm, but w varies between 800, 900, 1000, or 1100 nm. As shown in FIG. 2B, by increasing w, the responsivity peak shifts into longer wavelengths.

Figure 2C:
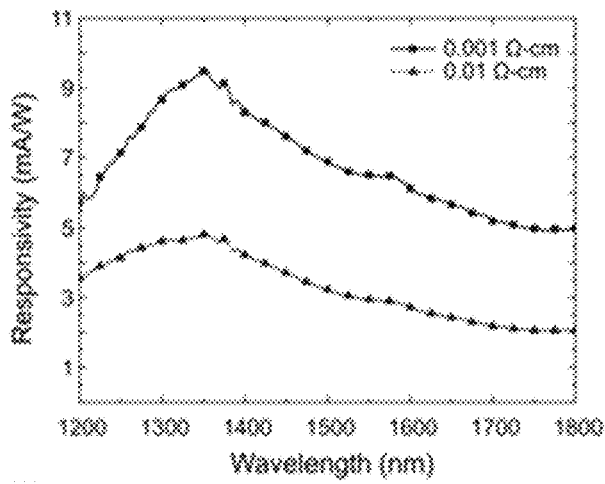

FIG. 2C shows responsivities of other examples of the IR photodetector that include palladium (Pd) gratings with w=900 nm, t=200 nm, and g=250 nm disposed on highly boron doped silicon substrates that have resistivities of about 0.01 and 0.001 Ω·cm.

Figure 3A:
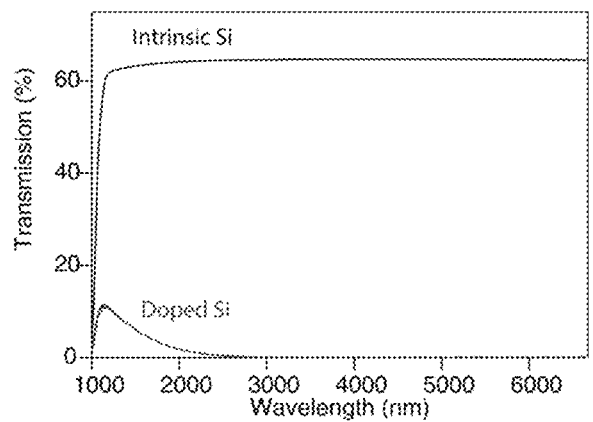
FIGS. 3A-3B show diagrams in accordance with one or more embodiments of the invention.

In the other absorption mechanism in accordance with one or more embodiments, the silicon substrate of the IR photodetector may absorb the IR light. Intrinsic (i.e., non-doped) silicon substrates transmit most of the received IR light. On the other hand, highly-doped silicon substrates absorb most of the received IR light. For example, FIG. 3A shows transmissions of ~350 micrometer (μm) thick intrinsic and highly-doped (boron-doped with a density of $5\times10^{18}$ $1/cm^3$) silicon substrates.

Figure 3B:
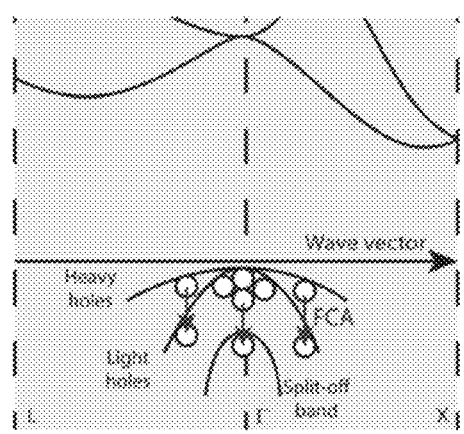

FIG. 3B shows the absorption mechanism of the IR light by the highly-doped silicon substrate. Upon receiving the IR light, the holes in the heavy hole band move to the light hole and split-off bands where the holes have smaller effective mass that in the heavy hole band, yielding a higher mobility for the holes. This way, the conductivity of the silicon substrate increases. In other words, the silicon substrate works as a photoconductor such that the IR light increases the conductivity of the photoconductor.

In one or more embodiments, the doping density (and consequently, the resistivity) of the silicon substrate is important for the amount of the IR light that the silicon substrate can absorb. In one or more embodiments, the resistivity of the highly-doped silicon substrate may be from 0.001 to 1 Ω·cm. In one or more embodiments, the resistivity of the highly-doped silicon substrate may be from 0.001 to 0.1 Ω·cm. In one or more embodiments, the resistivity of the highly-doped silicon substrate may be from 0.005 to 0.05 Ω·cm. In one or more embodiments, the resistivity of the highly doped silicon may be from 0.01 to 0.02 Ω·cm.

In one or more embodiments, a change in the conductivity of the silicon substrate may be measured to detect the IR light. For this, a voltage may be applied to the silicon substrate and the responsivity (i.e., the electric current generated a result of the absorption of the IR light divided by the power of the IR light) of the IR photodetector may be measured. For example, one pole of the voltage may be applied to the metal structure and the other pole may be applied to the silicon substrate, as shown in FIGS. 1A-1B.

Figure 4A:
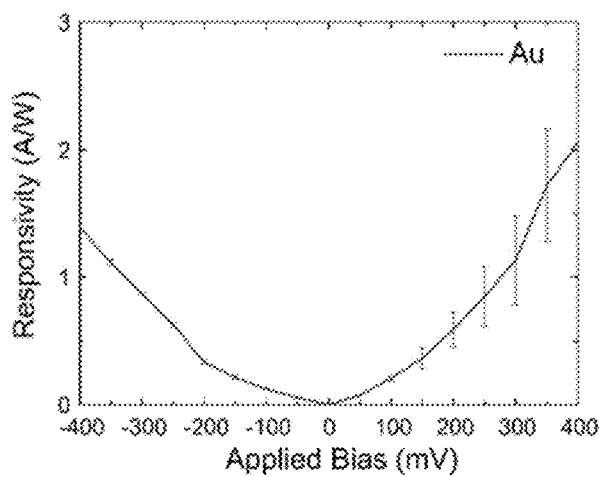
FIGS. 4A-4B show diagrams in accordance with one or more embodiments of the invention.

FIG. 4A shows an example of the responsivity of the IR photodetector, which corresponds to FIG. 2A, under various applied voltages. Under the applied voltages, the responsivity of the IR photodetector includes the responsivity due to the plasmonic absorption of the Au grating and the responsivity due to the conductivity increase of the silicon substrate. Thus, the overall responsivity may be higher than 1 A/W for an applied voltage of ±0.4 V.

Figure 4B:
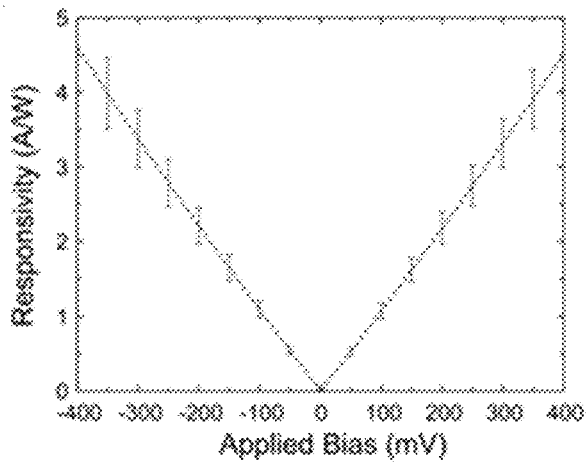

FIG. 4B shows another example of the responsivity of the IR photodetector, which corresponds to FIG. 2C, under various applied voltages. Under the applied voltages, the responsivity of the IR photodetector includes the responsivity due to the plasmonic absorption of the Pd grating and the responsivity due to the conductivity increase of the silicon substrate (with a resistivity of 0.01 Ω·cm). Thus, the overall responsivity may be about 4 A/W for an applied voltage of ±0.4 V. The higher responsivity for the Pd gratings rather than the Au/Ti gratings may be because of a better ohmic contact between Pd and silicon.

The metal structure works in two aspects for generating and measuring this electric current. In one aspect, the metal structure works as an electric contact to the silicon substrate. In the other aspect, the metal structure may filter the IR light such that the IR light received by the silicon substrate has peaks at certain wavelengths. This way, the responsivity of the IR detector will have peaks at wavelengths where the metal structure has higher transmissions.

Figure 5:
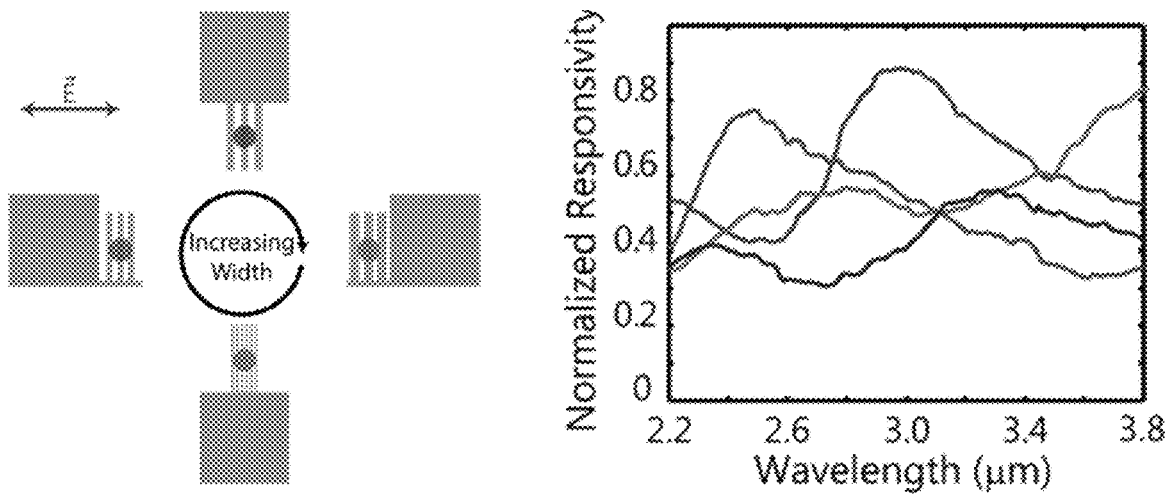
FIG. 5 shows a diagram in accordance with one or more embodiments of the invention.

FIG. 5 shows normalized responsivities of four aluminum (Al) gratings on a silicon substrate that is highly-doped with boron and has a resistivity of about 0.02 Ω·cm. The pitches of the Al gratings vary between 2000, 2375, 2625, and 3000 nm, while g is 20% of the pitch for each of the Al gratings. The Al gratings have the same t=300 nm. The responsivities of the IR photodetectors shown in FIG. 5, includes peaks at various wavelengths in the IR region shown in the figure.

Conventionally, complicated equipment such as Fourier-transform infrared (FTIR) and Raman spectrometers are used to determine molecular stretching modes of organic materials. For this, the IR light is illuminated on an organic material, which is on a substrate, and then, the scattered, reflected, or transmitted light is measured via a conventional photodetector that use expensive materials such as mercury cadmium telluride (CMT) to detect the IR light in the mid-IR regions.

Figure 6A:
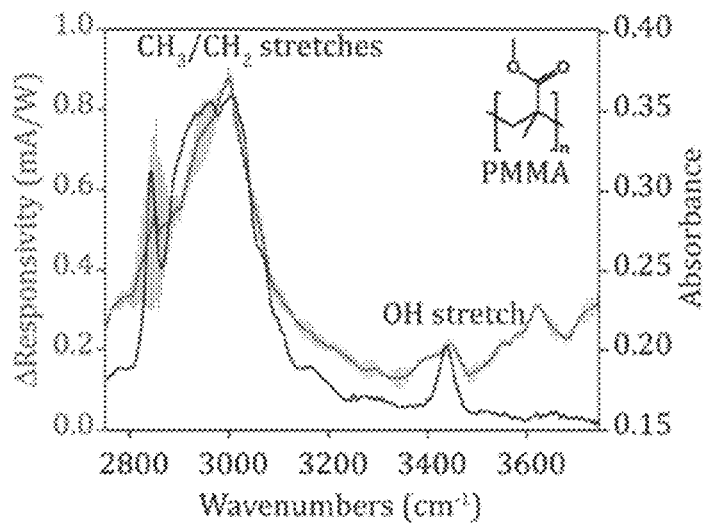
FIGS. 6A-6B show diagrams in accordance with one or more embodiments of the invention.
Figure 6B:
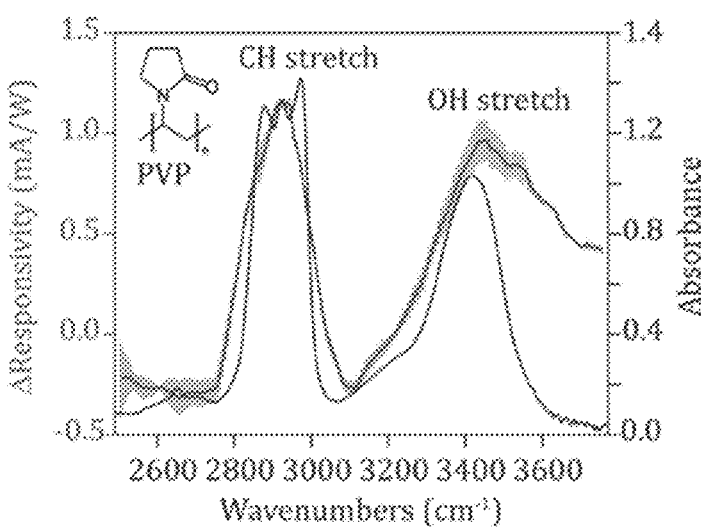

The IR photodetector in accordance with one or more embodiments may be used as an IR spectrometer that can identify an organic material by revealing the stretching modes of the organic material. The blue spectra in FIGS. 6A-6B show responsivities of two IR photodetectors that each includes an Al grating on a highly boron-doped silicon substrate. The IR photodetectors of these examples are coated with polyvinylpyrrolidone (PVP) (in FIG. 6A) and poly(methyl methacrylate) (PMMA) (in FIG. 6B). The black spectra in FIGS. 6A-6B show absorbance spectra of PVP and PMMA in the same IR region. Both the responsivity and absorbance spectra show $CH_2/CH_3$ and OH stretching modes for PVP and CH and OH stretching modes for PMMA.

In one or more embodiments, the organic material may be disposed between the IR photodetector and an IR light source such that IR light transmitted from the organic material is detected by the IR photodetector. For example, the organic material may be disposed on a quartz substrate that is spaced from the IR photodetector, and the IR photodetector receives and detects IR light transmitted from the organic material and the quartz substrate.

In one or more embodiments, the IR photodetector is advantageous over the MCT detectors because it is potentially significantly cheaper. This is because silicon, which is the main absorbing material of the IR photodetector, is significantly cheaper and more accessible than MCT.

In one or more embodiments, another advantage of the IR photodetector over the MCT detectors is that MCT detectors must be cooled down (for example, to less than −70° C.) to increase signal to noise ratio in order to detect the IR light. Otherwise, noise would be so high that makes detection of any signals generated by the IR light impossible. However, the IR photodetectors in accordance with one or more embodiments can operate at room temperature. In fact, the responsivities shown in FIGS. 5 and 6A-6B are taken at room temperature.

Figure 7A:
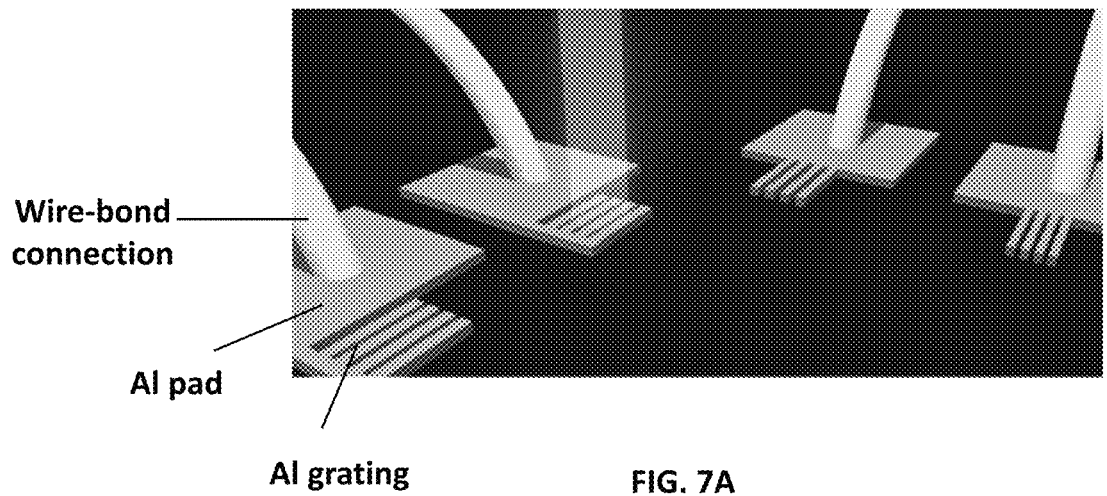
FIGS. 7A-7B show diagrams in accordance with one or more embodiments of the invention.
Figure 7B:
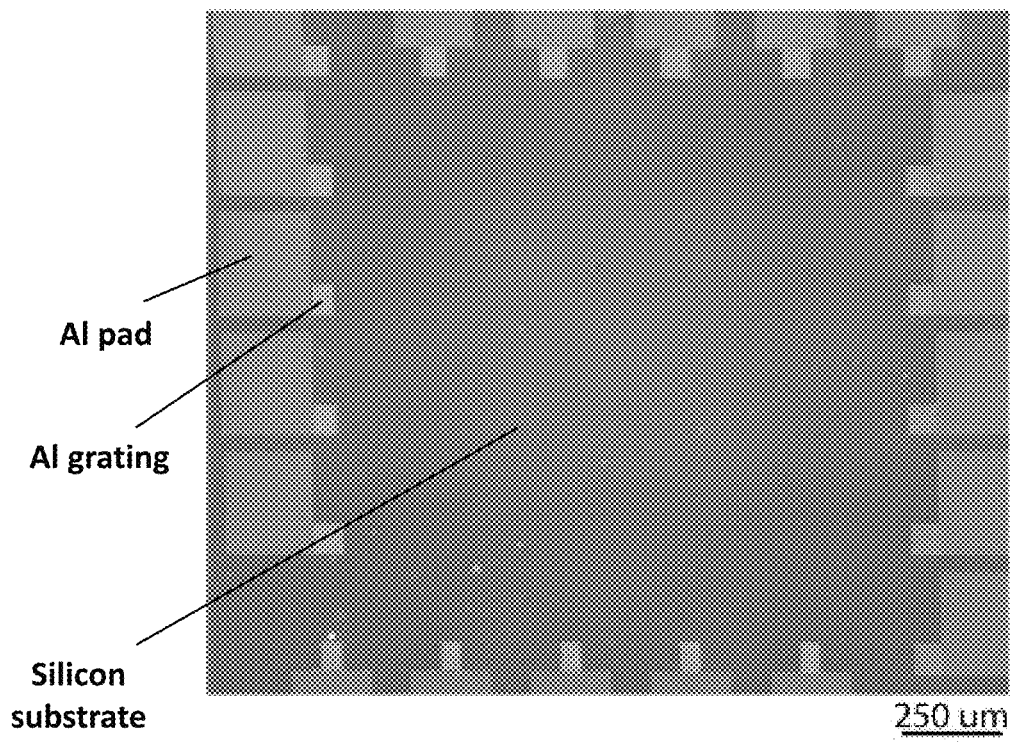

In one or more embodiments, a plurality of IR photodetectors can be used as an IR spectrometer. FIG. 7A shows a schematic of multiple IR photodetectors on the same silicon substrate. Each of the IR photodetectors includes an Al pad connected to an Al grating. The Al pads are connected to a chip carrier to insure secure connections to the Al pads. FIG. 7B shows 20 IR photodetectors each including an Al pad and an Al grating on a highly-doped silicon substrate.

As explained below, in accordance with one or more embodiments, it is possible to extract (i.e., reconstruct) an unknown IR light, $\vec{x}$, (input signal) transmitted through the organic material by knowing the electric current, $\vec{y}$, of each of the IR photodetectors and previously measured responsivity spectra of the IR photodetectors, stored in matrix D.

Figure 8:
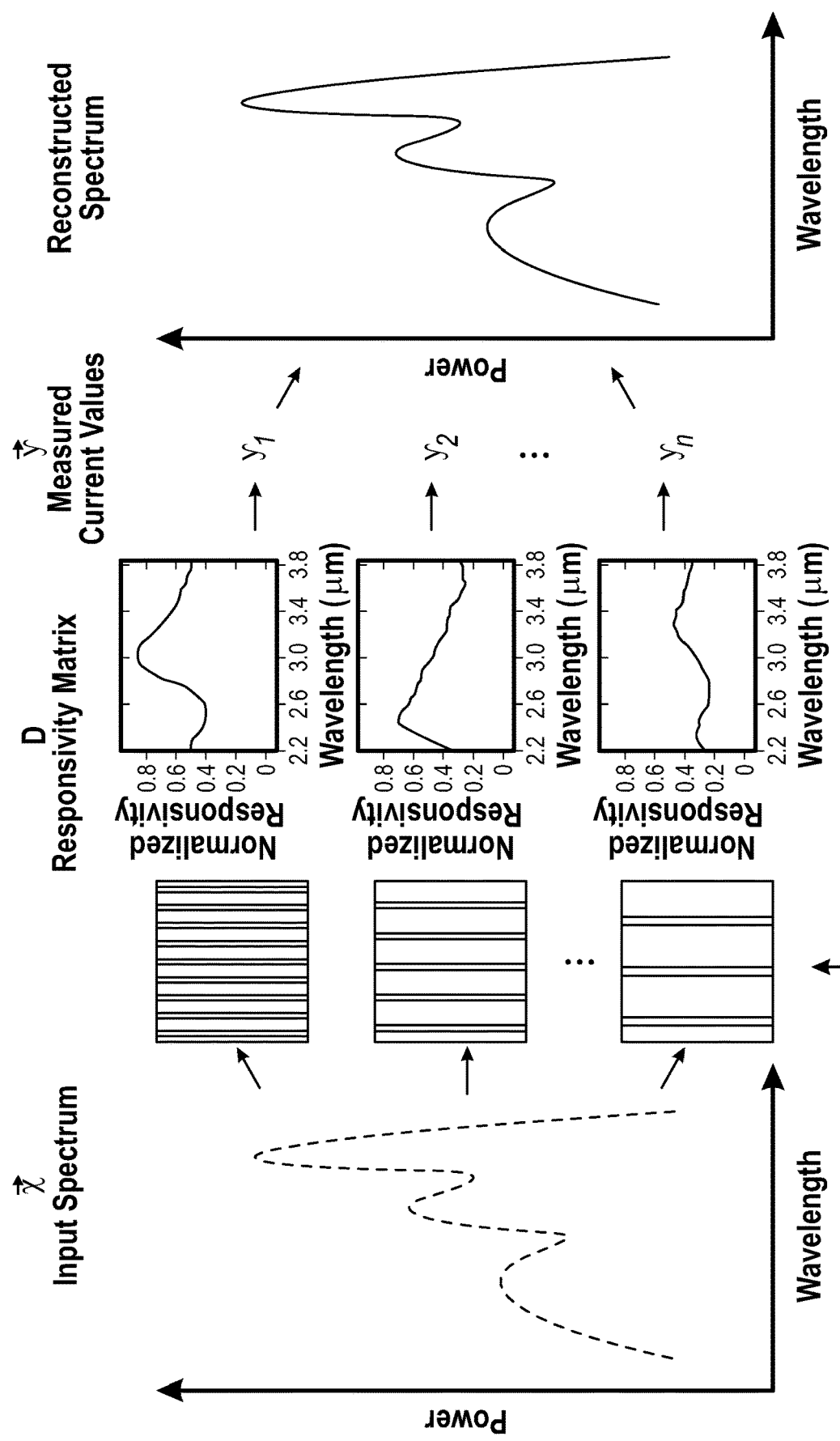
FIG. 8 shows a diagram in accordance with one or more embodiments of the invention.

FIG. 8 schematically shows the reconstruction process. First, the unknown input spectrum is illuminated on each of the IR photodetectors, and the electric current of each of the IR photodetectors is measured and stored in $\vec{y}$. For example, the input spectrum shown in FIG. 7 is illuminated on each of the IR photodetectors and electric currents of 10, 20, and 25 mA are measured for the top, middle, and bottom IR photodetectors. In this example, $\vec{y}$ is a matrix with three rows for the values of the electric currents and one column (i.e., $\vec{y}$ is 3×1). In addition, the responsivity spectrum of each of the IR photodetectors that is pre-measured is placed in D. The number of rows of D is the number of the IR photodetectors, and the number of columns of D is the number of wavelength sampling of the responsivities. For example, assuming there are three IR photodetectors with the responsivities shown in FIG. 8 and each of the responsivities includes 80 data points (80 responsivities with different wavelength). In this example, the size of D is 3×80. Finally, D and $\vec{y}$ are used to reconstruct $\vec{x}$.

In one or more embodiments, the mathematical approach to determine $\vec{x}$ may be a non-negative least-squares regression, as shown in equation (1).

$$\min_{x_i \geq 0} \|D\vec{x} - \vec{y}\|_2^2 \qquad (1)$$

Vector $\vec{x}$ will be determined to minimize the squared value of the $L^2$-norm, which is the following equation (2).

$$\|D\vec{x} - \vec{y}\|_2 = \|\vec{Z}\|_2 \stackrel{\scriptscriptstyle\Delta}{=} \sqrt{(z_1^2 + z_2^2 + \ldots)} \qquad (2)$$

In equations (1) and (2), one constraint may be that every element of $\vec{x}$ must be greater than or equal to 0. This technique may be limited in spectral resolution to the length of $\vec{y}$ that is the number of unique electric currents. To keep the solution tractable, the final reconstructed spectrum may only have as many data points as the number of the electric currents in $\vec{y}$. If the number of the data points in the reconstructed spectrum is increased beyond the number of electric currents, the reconstruction may become unsolvable. In other words, $\vec{x}$ and $\vec{y}$ are both of length n, and D is n×n, where n is the number of the IR photodetectors because each of the IR photodetectors produces a single electric current. For example, in the spectral range of 2200-3800 nm where n=20, the resolution of the final reconstructed input signal will be 80 nm.

In one or more embodiments, to improve the spectral resolution, the number of the IR photodetectors can be increased (i.e., increasing the length of $\vec{y}$). This way, the improvement in resolution may be linear with the increase in number of the IR photodetectors.

In one or more embodiments, another mathematical approach may be employed to obtain an improved spectral resolution of the reconstructed input spectrum to achieve a sub-Nyquist resolution.

In one or more embodiments, the responsivity matrix, D, can be sampled with higher resolution than the final reconstruction. For example, D may be considered to have a size of m×n, where m>n corresponds to the resolution with which the responsivity of each of the IR photodetectors is sampled. In addition, the responsivities may be smoothed by conventional signal processing methods such as interpolation between data points in the responsivities to further increase the effective resolution of D. This smoothing is proper and does not destructively alter the final reconstruction because the width of the responsivity peaks is much larger than the distance between the data points in the experimental measurements.

In one or more embodiments, the improved reconstruction may be based on a technique from compressive sensing for solving underdetermined problems by incorporating $L^1$-norm, which is the following equation (3).

$$\|\vec{Z}\|_1 \stackrel{\scriptscriptstyle\Delta}{=} |z_1| + |z_2| + \ldots \qquad (3)$$

In one or more embodiments, by using $L^1$-norm, as opposed to $L^2$-norm, the extra information contained in D may be used to increase the resolution of the reconstructed input spectrum.

In general, the steps for the reconstruction based on the $L^1$-norm may be as follows: first, define a complete set of curves that can be summed with varying magnitude to form any potential input signal of interest—this is called a dictionary, $\Psi$. Then, a sparse input signal, $\vec{s}$ (meaning most of the values of $\vec{s}$ are 0) may be defined based on the dictionary. For example, a Gaussian input light (which may be an illuminated IR light) may have only one non-zero value when expressed in a basis consisting of Gaussian curves. This way, the solution should be sparse in this new basis.

In one or more embodiments, these steps are summarized in the following steps 1-4:
1) defining an m×m dictionary matrix, $\Psi$;
2) expressing the reconstructed input signal $\vec{x}$, as a new vector, $\vec{s}$, of length m multiplied by this dictionary set, $$\Psi \vec{s} = \vec{x}; \qquad (4)$$

3) retaining the extra information in D, allowing it to be of size m×n; and
4) incorporating the new $L^1$ constraint into the following fitting algorithm, $$\min_{s_i \geq 0} \|D\Psi\vec{s} - \vec{y}\|_2^2 + \lambda \|\vec{s}\|_1. \qquad (5)$$

In one or more embodiments, $\lambda$ is introduced as a thresholding parameter to apply sparsity in the final solution. In other words, vector $\vec{s}$ that has the fewest number of nonzero elements possible is to be determined, while still minimizing equation (4) and setting values smaller than $\lambda$ to 0.

In one or more embodiments, the spectral resolution of the reconstructed input signal may be doubled by using the regression method in equation (5).

Figure 9A:
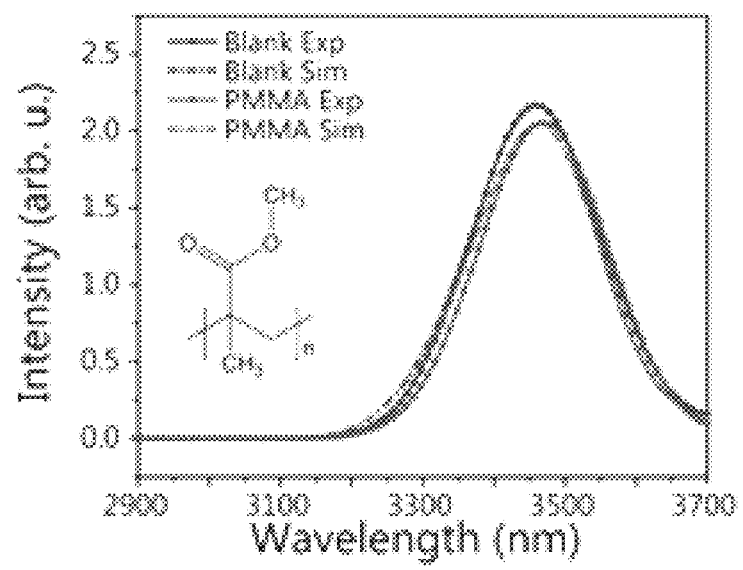
FIGS. 9A-9C show diagrams in accordance with one or more embodiments of the invention.

In one or more embodiments, to demonstrate the viability of the microscale IR spectrometer for molecular detection, a quartz window coated with a thin layer (~2-3 μm) of PMMA is placed in the optical excitation path of the IR spectrometer. The optical intensity of the IR light transmitted from the quartz substrate with and without PMMA is measured by the IR spectrometer. As shown in FIG. 9A, PMMA causes a suppression of the optical intensity of the IR light. The spectrum of the input IR light is selected to match the $CH_2$ and $CH_3$ stretching region (3350-3400 nm).

Figure 9B:
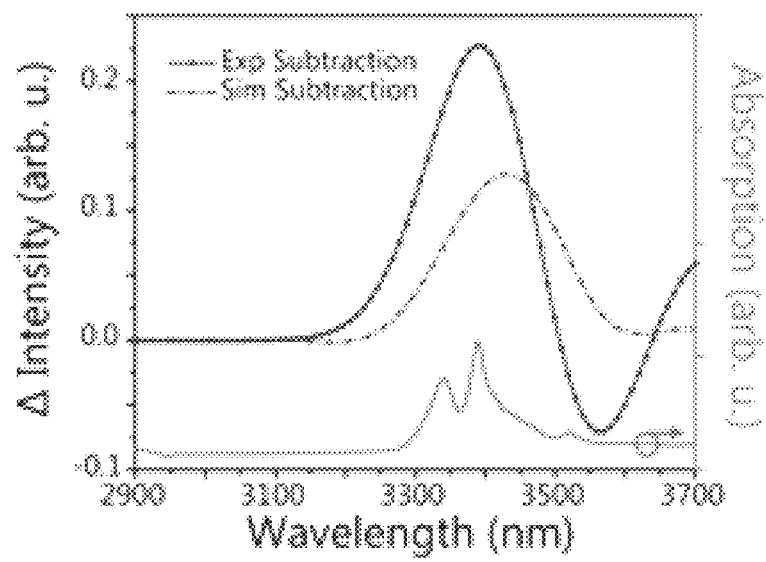

In one or more embodiments, simulations (dash-dot lines in FIG. 9A) verified that the measured change in intensity was due to absorption by the PMMA layer in the beam path. To perform these simulations, the predicted output of the IR light at a given wavelength was modulated by either the measured absorbance due to a blank quartz window or a window with the layer of PMMA. These simulated spectra were then used as inputs to the measured responsivity curves to generate a series of ideal current values for the IR photodetectors. Then, these idealized currents were fed into the spectral reconstruction algorithm to generate simulated reconstructed spectra. The peak heights match very well between the simulated and experimental spectra, demonstrating that the IR spectrometer can accurately measure the reduction in light intensity due to the PMMA absorption. This is particularly evident in the difference between the reconstructed spectra with and without the PMMA layer, as shown in FIG. 9B, where a prominent feature lines up very well with the PMMA absorption. Based on the observed noise in the measurements, the minimum detectable layer may be a factor of ~4 smaller than what was measured in this example, enabling the detection of a molecular layer approximately 0.6 μm thick without increasing the integration time of the measurements.

Figure 9C:
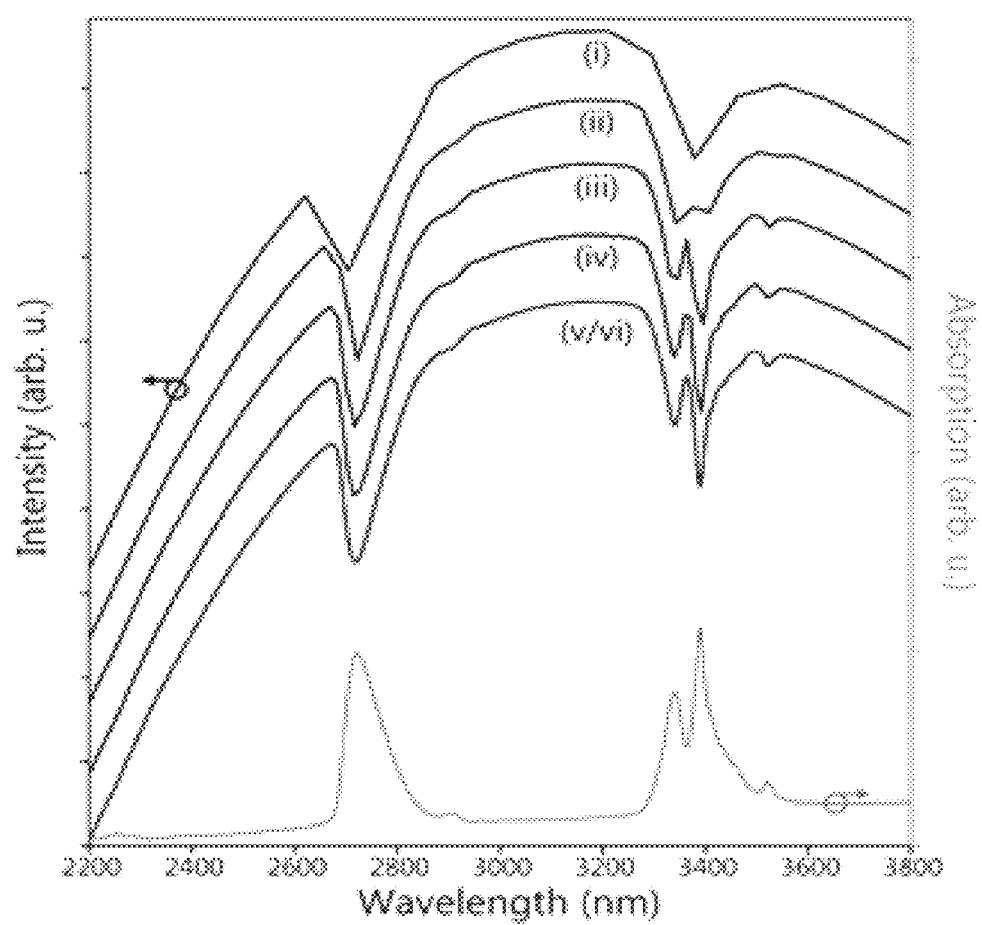

In one or more embodiments, to demonstrate the achievable resolution with the IR spectrometer, simulations were performed where the number of the IR photodetectors is increased until the stretching modes of PMMA are completely reproduced, as shown in FIG. 9C. In these simulations, the IR source is a blackbody source. These simulations were performed by generating random responsivities for the IR photodetectors, using the randomly selected responsivities to generate electric current values, and then using the electric current values to perform spectral reconstruction. As shown in FIG. 9C, by increasing the number of the IR photodetectors to 20 (i), 50 (ii), 100 (iii), 150 (iv), and 500 (v) IR photodetectors, the stretching modes of PMMA can be fully captured.

Although the disclosure has been described with respect to only a limited number of embodiments, those skilled in the art, having benefit of this disclosure will appreciate that various other embodiments may be devised without departing from the scope of the present invention. Accordingly, the scope of the invention should be limited only by the attached claims.

What is claimed is:

1. An infrared photodetector comprising:
   a p-type and highly doped silicon substrate;
   a metal structure disposed on the silicon substrate, wherein the metal structure is a grating structure;
   a first electric contact to the silicon substrate; and
   a second electric contact to the metal structure.

2. The infrared photodetector according to claim 1, wherein
   the metal structure has an optical resonance in an infrared spectral region,
   the doping density of the silicon substrate is high enough such that the resistivity of the silicon substrate changes due to free-carrier absorption in the silicon substrate.

3. The infrared photodetector according to claim 1, wherein the crystal orientation of the silicon substrate is <100>.

4. The infrared photodetector according to claim 1, wherein the resistivity of the silicon substrate is equal or greater than 0.001 and equal or less than 0.1 $\Omega \cdot cm$.

5. The infrared photodetector according to claim 1, wherein the resistivity of the silicon substrate is equal or greater than 0.005 and equal or less than 0.05 $\Omega \cdot cm$.

6. The infrared photodetector according to claim 1, wherein the resistivity of the silicon substrate is equal or greater than 0.01 and equal or less than 0.02 $\Omega \cdot cm$.

7. The infrared photodetector according to claim 1, wherein the metal structure is aluminum.

8. The infrared photodetector according to claim 1, wherein the metal structure comprises a gold layer disposed on a titanium layer.

9. The infrared photodetector according to claim 1, wherein the metal structure is disposed directly on the silicon substrate and that creates an ohmic contact with the silicon substrate.

10. The infrared photodetector according to claim 1, further comprising:
    a power source that is connected to the first and second electrical contacts;
    an infrared light source that emits light on the metal structure; and
    a polarizer that polarizes light emitted from the light source.

11. The infrared photodetector according to claim 10, further comprising optical elements that focus the emitted light on the metal structure.

12. An infrared spectrometer comprising:
    a plurality of the infrared photodetectors according to claim 1; and
    an infrared light source.

13. The infrared spectrometer according to claim 12, further comprising optical elements that focus infrared light of the light source on the infrared photodetectors.

14. A method of measuring an absorbance spectrum of a material, the method comprising:
    emitting infrared light on a plurality of infrared photodetectors such that the infrared light transmits through the material before reaching the infrared photodetectors;
    measuring an electrical signal of each of the infrared photodetectors generated in response to absorption of the infrared light by the infrared photodetectors; and
    calculating the absorption spectrum of the material based on the electrical signals of the infrared photodetectors and responsivities of the infrared photodetectors,
    wherein the responsivity of each of the photodetectors is an electrical signal spectrum of the infrared photodetector divided by an infrared light spectrum that is received by the infrared detector and results into generating the electrical signal spectrum,
    wherein each infrared photodetector comprises a metal structure disposed on a silicon substrate, and
    wherein the metal structure is a grating structure.

* * * * *